United States Patent
Kim et al.

(10) Patent No.: US 7,612,385 B2
(45) Date of Patent: Nov. 3, 2009

(54) HIGH POWER LIGHT-EMITTING DIODE PACKAGE COMPRISING SUBSTRATE HAVING BEACON

(75) Inventors: Young-Woo Kim, Gwangsan-gu (KR); Tae-Hoon Kim, Buk-gu (KR); Young-Moon Yu, Yuseong-gu (KR)

(73) Assignee: Korea Photonics Technology Institute, Gwangju (KR)

( * ) Notice: Subject to any disclaimer, the term of this patent is extended or adjusted under 35 U.S.C. 154(b) by 439 days.

(21) Appl. No.: 11/323,487

(22) Filed: Dec. 30, 2005

(65) Prior Publication Data

US 2008/0019133 A1 Jan. 24, 2008

(30) Foreign Application Priority Data

Jul. 15, 2005 (KR) ...................... 10-2005-0064512

(51) Int. Cl.
*H01L 29/22* (2006.01)
*H01L 33/00* (2006.01)
*H01L 27/15* (2006.01)
*H01L 29/267* (2006.01)
*H01L 31/12* (2006.01)
*H01L 29/16* (2006.01)
*H01L 23/02* (2006.01)

(52) U.S. Cl. ............................. 257/99; 257/81; 257/82; 257/433; 257/434; 257/680; 257/E23.08; 257/E23.101; 257/E23.102; 257/E33.056; 257/E33.058; 257/E33.075

(58) Field of Classification Search ............. 257/81–82, 257/99, 433–434, 680, E23.08, E23.101, 257/E23.102, E33.056, E33.058, E33.075

See application file for complete search history.

(56) References Cited

U.S. PATENT DOCUMENTS

| | | | | |
|---|---|---|---|---|
| 5,925,898 A * | 7/1999 | Spath | ........................... | 257/98 |
| 6,599,768 B1 * | 7/2003 | Chen | ........................... | 438/22 |
| 6,782,610 B1 * | 8/2004 | Iijima et al. | ................... | 29/827 |
| 6,799,864 B2 * | 10/2004 | Bohler et al. | ............... | 362/236 |
| 6,936,855 B1 * | 8/2005 | Harrah | ........................ | 257/88 |
| 7,042,021 B2 * | 5/2006 | Isoda | ........................... | 257/98 |
| 7,119,422 B2 * | 10/2006 | Chin | ........................... | 257/666 |
| 7,129,638 B2 * | 10/2006 | Ng | ............................... | 313/512 |
| 7,138,667 B2 * | 11/2006 | Barnett et al. | .................. | 257/99 |
| 7,187,010 B2 * | 3/2007 | Tsukagoshi | ................... | 257/99 |
| 7,190,585 B2 * | 3/2007 | Houle | ......................... | 361/704 |
| 7,456,499 B2 * | 11/2008 | Loh et al. | .................... | 257/710 |

(Continued)

*Primary Examiner*—Ida M Soward
(74) *Attorney, Agent, or Firm*—Baker & Hostetler LLP (57) ABSTRACT

Disclosed herein is a package structure including at least one high power light-emitting diode to exhibit excellent heat release properties. In the package structure, a light-emitting diode chip which generates heat is directly attached to a beacon processed to protrude from part of a heat spreader having high heat conductivity, whereby an electrical wiring portion is separated from a heat release portion, thus maximizing heat release properties and realizing high luminance and reliability. The package structure is composed of a beacon formed on a metal or non-metal substrate having high heat conductivity to mount a high power light-emitting diode chip, to increase heat release properties; a wiring portion provided on the same line as the diode to input and output power and signals; and a reflection cup having a cavity, which may be inserted into or attached to the heat spreader or the wiring substrate, including a low temperature co-fired ceramic substrate, a high temperature co-fired ceramic substrate, or a printed circuit board.

12 Claims, 5 Drawing Sheets

U.S. PATENT DOCUMENTS

| | | |
|---|---|---|
| 2004/0227149 A1* | 11/2004 | Ibbetson et al. ............. 257/100 |
| 2005/0077616 A1* | 4/2005 | Ng et al. ..................... 257/707 |
| 2005/0242362 A1* | 11/2005 | Shimizu et al. .............. 257/99 |
| 2006/0049475 A1* | 3/2006 | Wang et al. ................. 257/432 |
| 2006/0086945 A1* | 4/2006 | Wang et al. .................. 257/99 |
| 2006/0102917 A1* | 5/2006 | Oyama et al. ................ 257/99 |
| 2006/0170332 A1* | 8/2006 | Tamaki et al. ............... 313/498 |
| 2007/0018175 A1* | 1/2007 | Mazzochette et al. ......... 257/81 |
| 2007/0291503 A1* | 12/2007 | Friedrich et al. ............ 362/545 |
| 2008/0278954 A1* | 11/2008 | Speier ........................ 362/373 |

* cited by examiner

PRIOR ART

HIGH POWER LIGHT-EMITTING DIODE PACKAGE COMPRISING SUBSTRATE HAVING BEACON

BACKGROUND OF THE INVENTION

1. Field of the Invention

The present invention relates to a high power light-emitting diode (HP LED) package, which includes a predetermined substrate having a protruding portion (hereinafter, referred to as a 'beacon') to improve heat release performance and increase the lifetime of the HP LED, by enabling direct mounting of the IHP LED, which generates heat, on a metal or non-metal substrate having high heat conductivity, and eliminating wiring, which functions to apply signals and electric power, from a heat transfer path.

2. Description of the Related Art

Generally, an LED, which is formed of a Group III-V or II-VI compound semiconductor, including GaAs, AlGaAs, GaN, InGaN or AlGaInP, is a diode-able to emit its excess energy in the form of a photon upon coupling and recombination between electrons injected into an N layer and holes of a P layer through application of current. For example, there are a red LED using GaAsP, a green LED using GaP, a blue LED using a double hetero structure of InGaN/AlGaN, etc. Further, attempts to realize a white LED, including appropriately. combining RGB (Red, Green, Blue) LEDs and applying phosphor to the blue LED, have been made.

Although LEDs have been used as lamp type indicators to date, their application to backlight units of flat panel displays, general lighting fixtures, and automobiles, which can. be realized by increasing the luminance and light emission thereof, is under study.

Typically, an HP LED requires high luminance, a long lifetime and superior reliability, and its performance and properties are determined by color temperatures, luminance, and luminance intensities. To increase luminous efficiency, methods of increasing the degree of crystal growth of an active layer, an electron-injecting (N) layer and a hole-injecting (P) layer of the LED are first proposed. Additionally, the above performance of the LED is determined by a structure that efficiently releases heat, a controllable wiring structure, and a bonding process for connection of the diode to the wiring substrate. In realizing high light emission properties of the HP LED, the characteristics of the compound semiconductor material greatly affect the HP LED, thus various limitations are imposed on manufacturing such an LED. Hence, research into LED package structures is actively being carried out.

Moreover, the HP LED should have improved heat release properties, in order to obtain a long lifetime and high reliability. To this end, a surface mounted device (SMD) suitable for increasing heat release properties has been developed as shown in FIGS. 3, 4 and 5.

Figure 3:
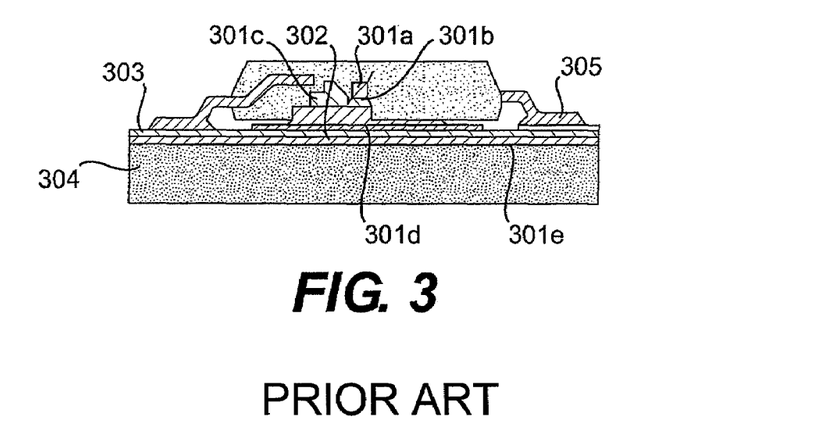
FIGS. 3, 4 and 5 are sectional-views showing conventional HP LEDs.
Figure 4:
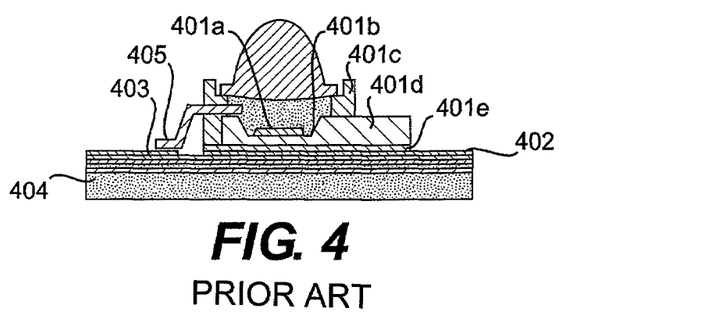
Figure 5:
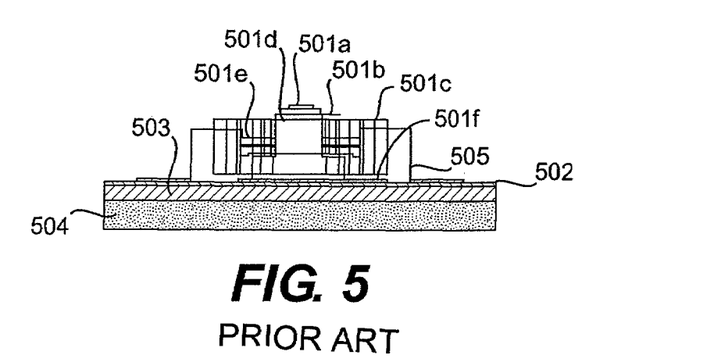

Referring to FIGS. 3, 4 and 5, a flip-chip bonding or wire-bonding type HP LED 301a, 401a, 501a is attached to the upper surface of a heat slug 301c, 401d, 501d using a solder or an adhesive having improved heat conductivity 301b, 401b, 501b, after which the heat slug is attached to the upper surface of a wiring substrate using an adhesive having improved heat conductivity 301d, 401e, 501f. The wiring substrate includes a wiring layer 303, 402, 502 and an insulating layer 302, 403, 503 to electrically insulate the wiring layer from a heat spreader 304, 404, 504 made of aluminum (Al), copper (Cu), or ceramic (SiC, AlN or AlSiC) having high heat conductivity, each of which is sequentially laminated on the heat spreader. For bonding the wiring substrate with the heat slug 301c, 401d, 501d, solder or adhesive having improved heat conductivity 301d, 401e, 501f is used. In addition, a reflection cup 401d is provided to improve the angle of light distribution from the LED and the luminance of the LED. The heat generated from the LED is simultaneously released through three pathways, that is, conduction, convection and radiation. The heat is transferred through the media connected to the LED, sequentially from the medium having the highest heat conductivity to the medium having the lowest heat conductivity. Therefore, heat is transferred through conduction into the package, formed of a conductor and a semiconductor having high heat conductivity, in an amount greater than that transferred through convection and radiation out of the package exposed to air having heat conductivity of 0.024 W/mK (@° C.). From this, it should be noted that heat is preferably released from the package through conduction. With respect to heat release, the principle of the conduction for transferring heat to a predetermined region obeys a Fourier's law. A heat transfer rate is represented by Equation 1 below:

$$q = -kA\left(\frac{dT}{dx}\right) \qquad \text{Equation 1}$$

In Equation 1, q shows a heat transfer rate and is in proportion to heat conductivity k of a medium to be conducted, an area A thereof, and a change of temperature to distance dT/dx.

In the case where the HP LED coexists with a material having low heat conductivity in a small space on a heat transfer-path, its heat transfer rate is decreased. Further, thermal fatigue accumulates in the HP LED. When electrons are injected into the N layer of the HP LED, a scattering phenomenon occurs due to collisions of lattice atoms of the semiconductor. The higher the temperature, the more the lattice scattering. Thereby, electron mobility and. forward voltage and current are decreased, and less coupling and recombination with the holes result, thus the luminous efficiency of the HP LED may be lowered and the HP LED may malfunction. The individual structures shown in FIGS. 3, 4 and 5 include at least three barrier layers having low heat conductivity upon transfer of heat from the HP LED to the heat spreader 304, 404, 504. As seen in FIGS. 3, 4 and 5, the first barrier layer is the adhesive 301b, 401b, 501b having improved heat conductivity used to attach. the HP LED 301a, 401a, 501a to the heat slug 301c, 401d, 501d, and has heat conductivity of 0.3~1 W/mK and a thickness. of 50~150 μm. The second barrier layer is the solder or adhesive 301d, 40/e, 501f used to attach the heat slug to the wiring. layer 303, 402, 502 of the wiring substrate, and has heat conductivity of 37~55 W/mK depending on the proportions of tin (Sn) and lead (Pb) when using solder, and heat conductivity of 0.3~1 W/mK when using adhesive having improved heat conductivity, with a thickness of 50~100 μm. The third barrier layer is the insulating layer 302, 403, 503 of the wiring substrate, and has heat conductivity of 0.35~23 W/mK and a thickness of 50 μm or more. Even if the types of HP LED mounted in FIGS. 3, 4 and 5 are the same, the junction temperature of the HP LED may be greatly increased by the kinds, thicknesses and structures of heat transfer media. In particular, as the number of junction layers having low heat conductivity is increased, these layers function as heat barriers, thus increasing thermal fatigue.

Consequently, the HP LED becomes unreliable in view of long-term operation and performance.

SUMMARY OF THE INVENTION

Accordingly, the present invention has been made keeping in mind the above problems occurring in the related art, and an object of the present invention is to provide an HP LED package, which is advantageous because at least one LED is attached to the beacon of a heat spreader formed of metal or non-metal having high heat conductivity, and also, a wiring substrate is attached to the heat spreader to separate a heat transfer path from an application portion of electric power and signals, thus decreasing a junction temperature and heat resistance of the HP LED, resulting in low thermal fatigue, excellent heat release properties, and high luminance.

In order to achieve the above object, the present invention provides an HP LED comprising a substrate having a beacon, comprising an HP LED to emit light; a heat spreader to release heat generated from the HP LED and including a beacon formed thereon for mounting of the HP LED; a wiring substrate to supply external electric power to the HP LED; and a reflection cup to increase luminous efficiency of the HP LED.

In the present invention, the HP LED preferably further comprises phosphor formed on the HP LED to determine the color of light emitted from the HP LED.

In the present invention, the HP LED preferably further comprises an encapsulant provided on the phosphor.

In the present invention, the HP LED is preferably attached to the beacon using an adhesive.

In the present invention, the HP LED preferably further comprises a conduction preventing layer formed between the wiring substrate and the reflection cup to prevent electrical conduction therebetween.

In the present invention, the HP LED preferably further comprises an insulating layer formed between the wiring substrate and the heat spreader to prevent short-circuit therebetween.

In the present invention, a vertical section of the beacon may be any one shape selected from among a planar shape, a groove shape, and a stepped shape.

In the present invention, the heat spreader is preferably formed using at least one process selected from among an extruding process, a molding process, and a plating process.

In the present invention, the heat spreader is preferably plated with nickel and then silver or gold upon bonding with the wiring substrate.

In the present invention, the reflection cup is preferably plated with silver to increase reflectance and luminance.

In the present invention, the insulating layer is preferably formed of any one material selected from among low temperature co-fired ceramic, high temperature co-fired ceramic, ceramic, FR-4, epoxy, and mixtures thereof.

In the present invention, the insulating layer preferably has a thickness of 50 µm or more.

In the present invention, at least one HP LED is preferably mounted on a single beacon.

In the present invention, the HP LED preferably further comprises a connector to input external signals and electric power.

In the present invention, at least one beacon is preferably formed on a single heat spreader.

In the present invention, the wiring layer of the wiring substrate should be positioned on the same line as the HP LED to be wire bonded therewith. In addition, the HP LED may be attached to the upper surface of the beacon of the heat spreader using an adhesive having high heat conductivity. The reflection cup having a cavity may be formed to surround the region required for mounting the HP LED, and the short-circuit prevention layer may have insulating properties to prevent the generation of electrical short-circuit between the wiring layer of the wiring substrate and the reflection cup.

In the present invention, the upper surface of the beacon, on which the HP LED is mounted, may be formed into a flat structure, a groove structure in which the HP LED may be received, or a stepped structure. Thus, the position of the HP LED mounted on the beacon may vary depending on the height and structure of the HP LED. To realize a white HP LED using a blue HP LED, phosphor may be applied in a manner that prevents it from flowing down.

The luminance of the HP LED and the angle of light distribution-from the HP LED may be controlled by changing the tilt angle formed by the difference between the upper and lower diameters of the cavity of the reflection cup and the area surrounding the HP LED. In addition, the design may be changed, added to or deleted from, if necessary.

The height of the beacon may be controlled so that the lower end of the cavity of the reflection cup is designed to be lower than the light-emitting position of the HP LED. Thereby, light is not emitted to the lower end of the HP LED, and thus, the luminous efficiency is desirably increased.

In addition, when the HP LED is attached to the beacon of the heat spreader, the adhesive having high heat conductivity may be used, so as to transfer heat to the heat spreader. Therefore, compared to conventional structures having three heat barrier layers shown in FIGS. 3 to 5, the number of heat barrier layers of the HP LED of the present invention may be decreased to one, and thermal fatigue, junction temperature, and thermal resistance may be drastically reduced.

Further, in the present invention, for heat release, the HP LED may be attached to the beacon, and as well, the phosphor and the encapsulant, each of which is formed of an insulating material having heat conductivity higher than air, may be provided over the HP LED mounted on the beacon of the heat spreader to be connected in the cavity of the reflection cup, thus enhancing the functions of the HP LED. Hence, heat may spread toward the reflection cup and the wiring substrate via the encapsulant before being released to air by convection and radiation, thereby realizing an enlarged heat release area.

In the present invention, the HP LED package having hundreds of lumens may be realized in the form of a multi-chip HP LED package having multi-chip arrays, by mounting at least one HP LED to a single beacon, and also forming a plurality of beacons on the heat spreader.

DESCRIPTION OF THE PREFERRED EMBODIMENTS

Hereinafter, a detailed description will be given of the preferred embodiments of the present invention, with reference to the appended drawings. Reference will now be made in detail to the preferred embodiments of the present invention, examples of which are illustrated in the accompanying drawings, wherein like reference numerals refer to like elements throughout. The description of known functions and structures, which is considered unnecessary in the present invention, is omitted.

Figure 1:
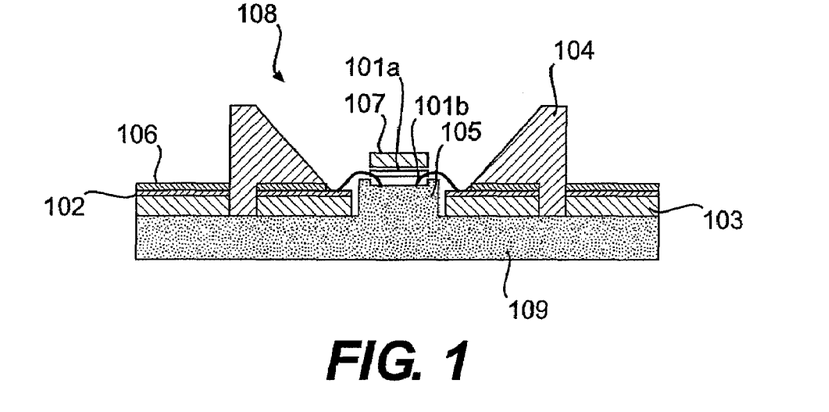
FIG. 1 is a sectional view showing an HP LED package, according to the present invention.
Figure 2:
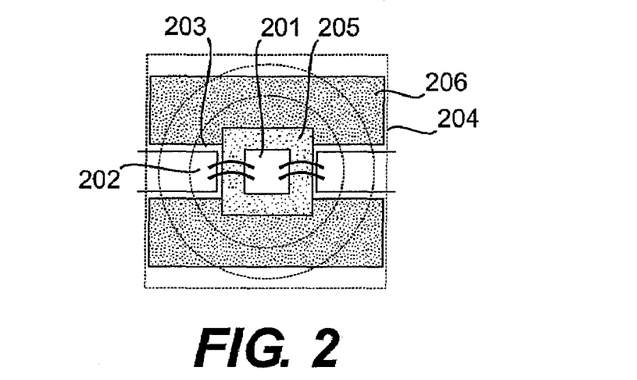
FIG. 2 is a top plan view showing the HP LED package, according to the present invention.

FIGS. 1 and 2 are a sectional view and a top plan view, respectively, showing an HP LED package, according to the present invention.

The HP LED package of the present invention comprises a beacon 105, 205 processed to protrude from part of a heat spreader 109, 206; an HP LED 101a, 201 mounted on the beacon; an adhesive 101b having improved heat conductivity and used to attach the HP LED to the beacon 105, 205; a wiring layer 102, 202 of a wiring substrate formed on the same line as the HP LED to be electrically connected to the HP LED; an insulating layer 103 to prevent short-circuit between the wiring layer 102, 202 and the heat spreader; a conduction preventing layer 106, 203 to prevent electrical conduction between the wiring layer 102, 202 and a reflection cup 104, 204 having a cavity; a phosphor 107 formed on the HP LED; and an encapsulant 108 applied on the phosphor 107.

The heat spreader 109, 206 including the beacon should be formed of a material having high heat conductivity, regardless of the kind of metal or non-metal. In addition, the heat spreader may be prepared using any process, including, but not being limited to, a cutting process, an extruding process, a molding process, or a plating process. For adhesion to the wiring substrate, in the case of using a soldering process and a brazing process, the heat spreader may be plated with nickel (Ni) and then silver (Ag) or gold (Au), to increase adhesive strength. In addition, in the case of using an adhesive, the heat spreader may be plated with nickel (Ni) and then silver (Ag) or gold (Au), or may have a mechanically and chemically roughened upper surface, with the exception of the beacon, to increase adhesive strength.

Figure 8:
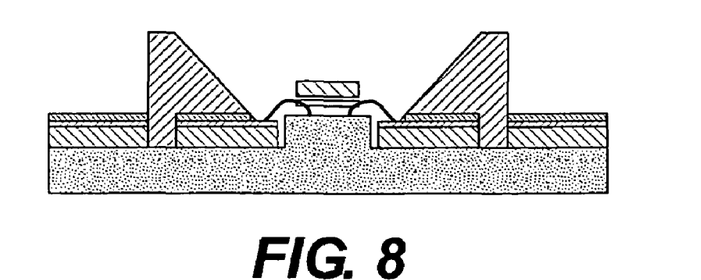
FIGS. 8, 9 and 10 are sectional views showing the beacon structures in the HP LED package, according to the present invention.
Figure 9:
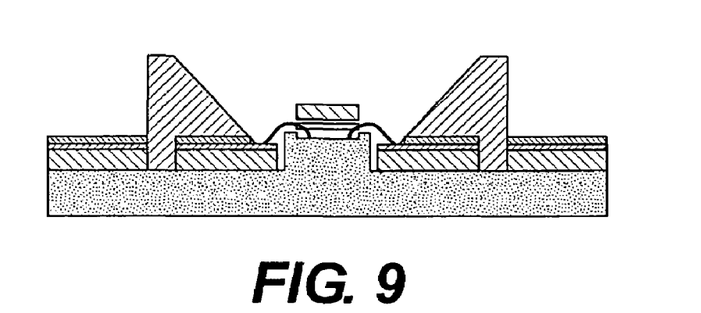
Figure 10:
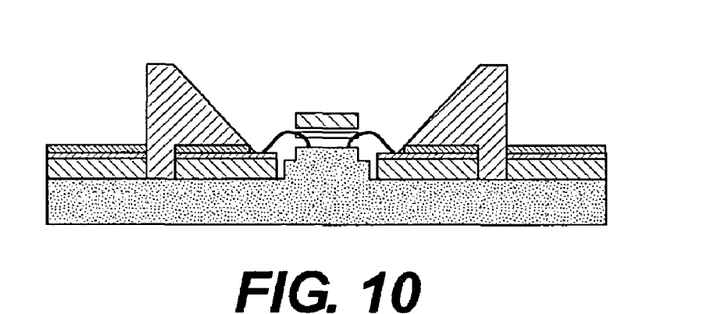

FIGS. 8, 9 and 10 illustrate the beacon structures processed in the flat-, groove- or stepped-shape to mount the HP LED thereon, according to the present invention.

The reflection cup 104, 204 having a cavity may be easily prepared through extrusion using copper, aluminum flake or plastic, but is not limited to such a process. To increase reflectance and luminance, the reflection cup may be plated with silver (Ag). The upper and lower diameters of the reflection cup may be controlled to be different from each other, depending on the height of beacon and the types of HP LED to be mounted, thus exhibiting maximum performance.

Figure 6:
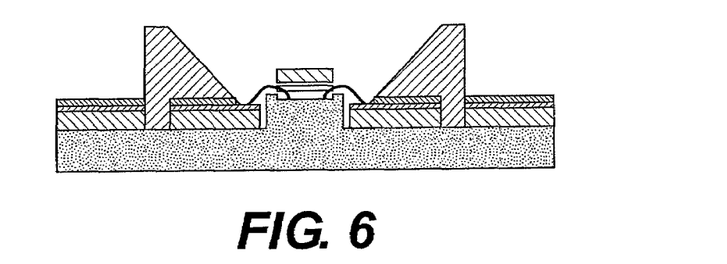
FIGS. 6 and 7 are sectional views showing the reflection cup structures provided to the HP LED package, according to the present invention.
Figure 7:
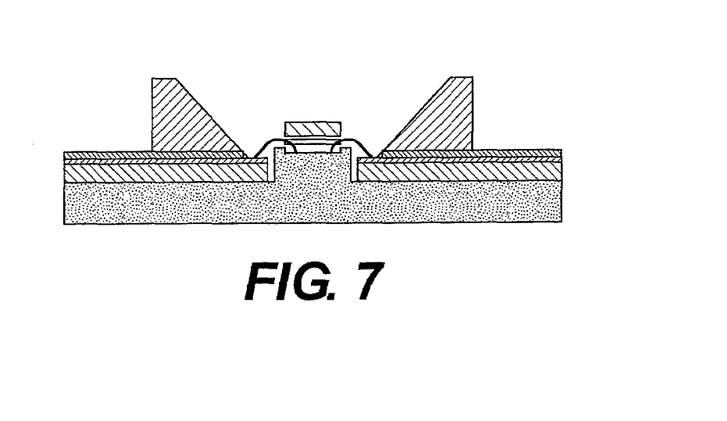

The reflection cup having a cavity may be provided in various shapes, depending on provision techniques, which are illustrated in FIGS. 1, 6 and 7.

FIG. 1 illustrates a reflection cup having a cavity inserted into the heat spreader, FIG. 6 illustrates a reflection cup inserted into the wiring substrate, and FIG. 7 illustrates a reflection cup attached to the wiring substrate, the above techniques including, for example, soldering or brazing using a solder, or a process using an adhesive, and the material being able to be unlimitedly used.

The insulating layer 103 of the wiring substrate is formed of low temperature co-fired ceramic (LTCC), high temperature co-fired ceramic (HTCC), or interlayer insulating PCB material, for example, ceramic, FR-4, or epoxy, with a thickness of 50 μm or more. Further, it is possible to form the wiring layer on any one selected from among a single-sided substrate, a double-sided substrate, and a multi-layered substrate. In this regard, the double-sided substrate, which is a substrate provided with wiring on upper and lower surfaces thereof, may be attached to the heat spreader by soldering, brazing and curing for compression and drying using an adhesive or solder. The single-sided substrate, which is a substrate provided with wiring only on an upper surface thereof, may be provided on the heat spreader 109, 206 by lamination through direct attachment or by printing through application of an insulating material.

The wiring substrate has a cavity in which the beacon 105, 205 is received, in which the cavity may be formed using a cutting process, a process of forming the cavity before lamination, or a punching process.

The phosphor 107 may be applied on the HP LED or not, depending on end purposes, and the encapsulant 108 may be incorporated into the reflection cup having a cavity using epoxy or silicon.

Figure 11:
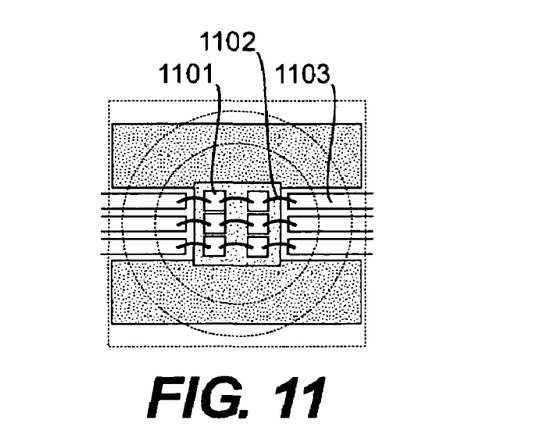
FIG. 11 is a top plan view showing a plurality of HP LEDs attached to a single beacon of a heat spreader, according to the present invention.

Turning now to FIG. 11, a plurality of HP LEDs mounted on a single beacon is illustrated. RGB HP LEDs 1101 are combined, thus realizing various colors, and the plurality of HP LEDs is attached to a single beacon, thereby increasing luminance intensity. In addition, various colors and high luminance intensity may be achieved by applying controlled signals through at, least one wiring pattern 1103. present outside the package, and also bonding wires 1102 for signal connections between the HP LED and the wiring pattern and between the HP LEDs.

Figure 12:
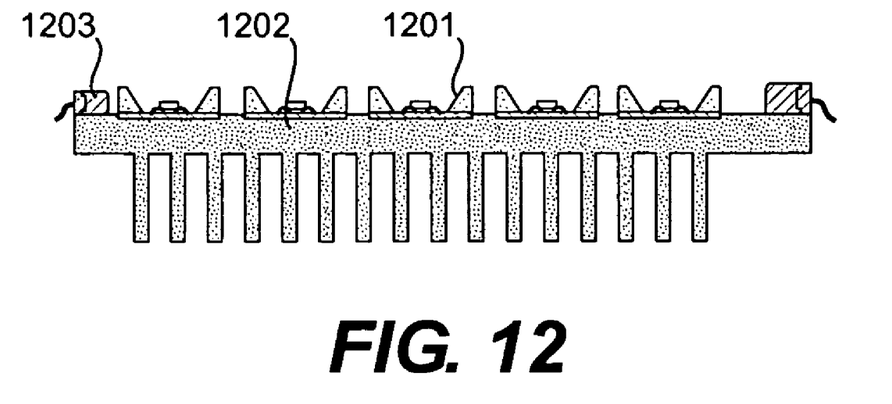
FIG. 12 is a sectional view showing the array of at least one HP LED package, according to the present invention.
Figure 13:
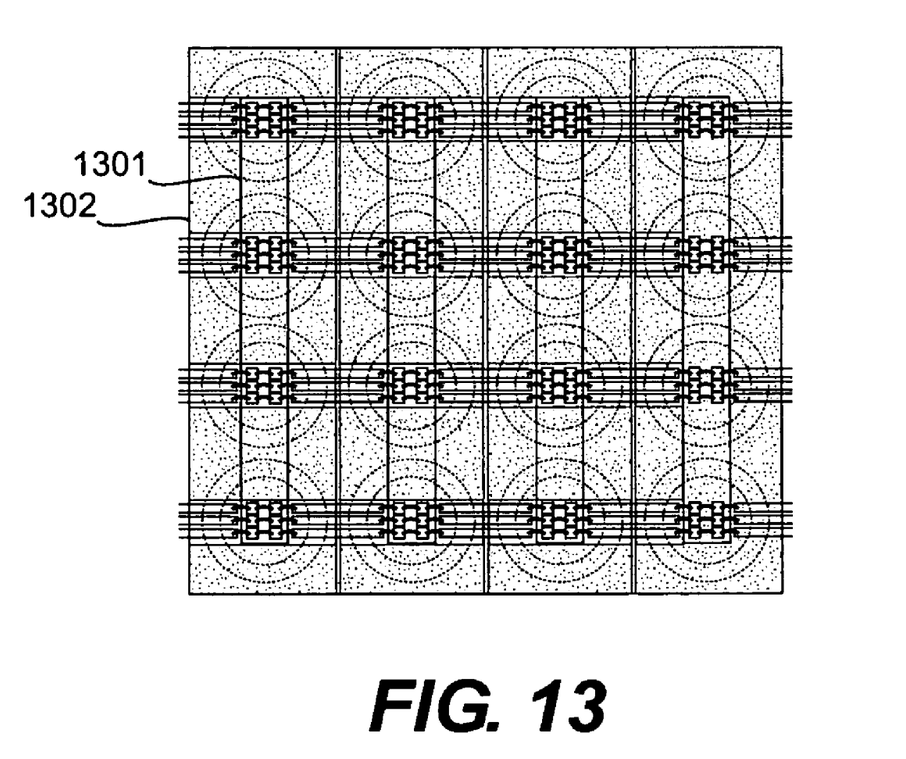
FIGS. 13 and 14 are top plan views showing the arrays of the at least one HP LED package, according to the present invention.
Figure 14:
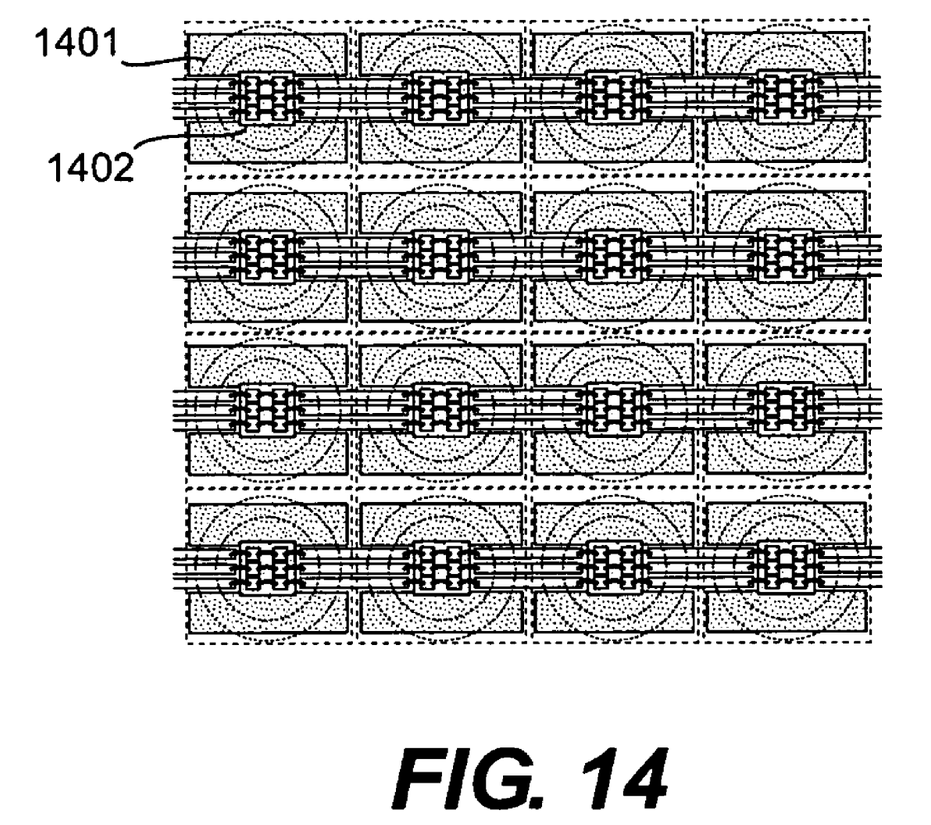

FIG. 12 is a sectional view showing a multi-chip HP LED package having performance ranging from tens of lumens (lm) to hundreds of lumens (lm) by arranging at least one package 1201 of FIG. 1 on a finned heat spreader 1202, and FIGS. 13 and 14 are top plan views showing the multi-chip HP LED package.

As shown in FIG. 12, external signals and electric power are input to the multi-chip HP LED package using a connector 1203. In addition, depending on end purposes, the HP LED package may further include a signal controller and thus be used as a module.

FIG. 13 illustrates the array of a plurality of HP LEDs attached to a single beacon, which is longitudinally formed on a heat spreader and includes a group. of reflection cups having cavities formed on the beacon. FIG. 14 illustrates the array of a plurality of HP LEDs attached to a single beacon, which is formed on a heat spreader and includes a single reflection cup having a cavity formed on the beacon.

The HP LED package thus formed has the following properties.

The junction temperature and thermal resistance of the LED of the present invention were measured. For comparison with the above results, the properties of a conventional structure shown in FIG. 5 were measured through simulation experiments. The comparison results are shown in Tables 1 and 2, below. When the same HP LEDs were applied, the junction temperature and thermal resistance of the HP LED of the present invention were confirmed to be improved by 3.8° C. and 4 W/mK, respectively, due to the package structure.

TABLE 1

| OBJECT | CONVENTIONAL | | | INVENTIVE | | |
|---|---|---|---|---|---|---|
| | MIN | MAX | MEAN | MIN | MAX | MEAN |
| S_L_MBAR_1 | 48.27 | 50.38 | 49.28 | 44.48 | 46.60 | 45.50 |
| S_L_MBAR_2 | 48.12 | 50.06 | 49.02 | 44.58 | 46.28 | 45.24 |
| S_L_MSBAR_1 | 46.16 | 49.76 | 47.66 | 42.38 | 45.98 | 43.87 |
| S_L_MSBAR_2 | 46.09 | 49.79 | 47.64 | 42.36 | 46.04 | 43.89 |
| S_L_MSBAR_3 | 46.27 | 49.95 | 47.82 | 42.50 | 46.17 | 44.04 |
| S_L_MSBAR_4 | 45.98 | 49.60 | 47.47 | 42.24 | 45.84 | 48.73 |
| S_L_SBAR_1 | 45.55 | 46.85 | 46.19 | 41.77 | 43.03 | 42.42 |
| S_L_SBAR_2 | 45.53 | 46.75 | 46.16 | 41.75 | 42.97 | 42.39 |
| S_L_SBAR_3 | 45.36 | 46.58 | 45.97 | 41.61 | 42.84 | 42.25 |
| S_L_SBAR_4 | 45.38 | 46.68 | 46.00 | 41.63 | 42.94 | 42.26 |
| S_N_CIR_1 | 45.58 | 48.03 | 45.87 | 41.83 | 42.28 | 42.12 |
| S_N_CIR_2 | 45.41 | 45.77 | 45.63 | 41.66 | 42.02 | 41.88 |
| S_N_CIR_3 | 45.60 | 46.08 | 45.90 | 41.85 | 42.34 | 42.16 |
| S_N_CIR_4 | 45.44 | 45.89 | 45.74 | 41.73 | 42.17 | 42.02 |
| S_N_CIR_5 | 45.28 | 45.63 | 45.49 | 41.57 | 41.91 | 41.78 |
| S_N_CIR_6 | 45.46 | 45.94 | 45.76 | 41.75 | 42.23 | 42.06 |
| S_N_LONGBAR_1 | 42.66 | 46.94 | 44.10 | 38.86 | 43.17 | 40.31 |
| S_N_LONGBAR_2 | 42.40 | 45.55 | 43.81 | 38.59 | 42.88 | 40.02 |
| S_N_LONGBAR_3 | 42.80 | 46.99 | 44.17 | 39.00 | 43.23 | 40.38 |
| JUNCTION TEMP MEAN | 45.44 | 47.49 | 46.30 | 41.68 | 43.74 | 42.54 |

TABLE 2

| | TEMPERATURE DEVIATION | | THERMAL RESISTANCE | |
|---|---|---|---|---|
| | CONVENTIONAL | INVENTIVE | CONVENTIONAL | INVENTIVE |
| N-SOLDER.1.1 | 5.349 | 5.362 | 6.363 | 6.383 |
| N-SOLDER.1.1.1 | 5.272 | 5.319 | 6.276 | 6.332 |
| N-SOLDER.1.2 | 5.202 | 5.244 | 6.192 | 6.243 |
| P-SOLDER.2 | 8.774 | 6.835 | 8.085 | 8.137 |
| P-SOLDER.2-2 | 7.485 | 7.551 | 8.887 | 8.989 |
| P-SOLDER.2-3 | 7.459 | 7.554 | 8.890 | 8.992 |
| SI_SUBMOUNT | 12.585 | 12.320 | 14.982 | 14.667 |
| ANODE | 11.982 | 12.024 | 14.265 | 14.314 |
| ANODE.1 | 12.013 | 12.050 | 14.301 | 14.346 |
| ANODE.1.1 | 11.268 | 11.310 | 13.414 | 13.464 |
| CATHOD | 10.766 | 10.853 | 12.816 | 12.920 |
| CATHOD.1 | 12.351 | 12.325 | 14.704 | 14.873 |
| CATHOD.1.1 | 12.204 | 12.163 | 14.529 | 14.503 |
| THERMO_PASTE | 18.037 | 14.739 | 21.473 | 17.546 |
| METAL_SUBSTRATE | 18.025 | 14.734 | 21.459 | 17.641 |

As described above, the present invention provides an HP LED package comprising a substrate having a beacon. According to the present invention, at least one LED is mounted on a beacon processed to protrude from part of a heat spreader formed of metal or non-metal having high heat conductivity, and also a wiring substrate is attached to the heat spreader, thereby decreasing the junction temperature and thermal resistance of the HP LED and reducing the thermal fatigue thereof. Therefore, the HP LED package of the present invention has high reliability, superior heat release properties, and high luminance.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A high power light-emitting diode package comprising a substrate having a beacon, comprising:
a high power light-emitting diode to emit light;
a heat spreader to release heat generated from the high power light-emitting diode and including a beacon formed thereon for mounting of the high power light-emitting diode;
a wiring substrate to supply external electric power to the high power light-emitting diode;
a reflection cup to increase emission efficiency of light emitted form the high power light-emitting diode; and
a condition preventing layer formed between the wiring substrate and the reflection cup to prevent electrical conduction therebetween.

2. The package as set forth in claim 1, wherein a number of beacons formed on a single heat spreader is one or more.

3. The package as set forth in claim 1, wherein a number of high power light-emitting diodes mounted on a single beacon is one or more.

4. The package as set forth in claim 1, further comprising a connector to input external signals and electric power.

5. The package as set forth in claim 1, wherein a vertical section of the beacon comprises any one shape selected from a planar shape, a groove shape, and a stepped shape.

6. The package as set forth in claim 1, wherein the heat spreader is plated with nickel to form a nickel plated layer, which is then plated with silver or gold, upon bonding with the wiring substrate.

7. The package as set forth in claim 1, wherein the reflection cup is plated with silver to increase reflectance and luminance.

8. The package as set forth in claim 1, further comprising a phosphor formed on the high power light-emitting diode to determine color of light emitted from the high power light-emitting diode.

9. The package as set forth in claim 8, further comprising an encapsulant provided on the phosphor.

10. The package as set forth in claim 1, further comprising an insulating layer formed between the wiring substrate and the heat spreader to prevent short-circuit therebetween.

11. The package as set forth in claim 10, wherein the insulating layer is formed of any one material selected from among low temperature co-fired ceramic, high temperature co-fired ceramic, ceramic, FR-4, epoxy, and mixtures thereof.

12. The package as set forth in claim 10, wherein the insulating layer has a thickness of 50 mm or more.

* * * * *